United States Patent
Nishiyama

(10) Patent No.: US 11,791,440 B2
(45) Date of Patent: Oct. 17, 2023

(54) METHOD OF MANUFACTURING LIGHT EMITTING ELEMENT

(71) Applicant: NICHIA CORPORATION, Anan (JP)

(72) Inventor: Hirofumi Nishiyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 687 days.

(21) Appl. No.: 16/899,183

(22) Filed: Jun. 11, 2020

(65) Prior Publication Data

US 2020/0395509 A1 Dec. 17, 2020

(30) Foreign Application Priority Data

Jun. 13, 2019 (JP) .................................. 2019-110506

(51) Int. Cl.
*H01L 33/38* (2010.01)
*H01L 33/00* (2010.01)
*H01L 33/44* (2010.01)
*H01L 33/24* (2010.01)

(52) U.S. Cl.
CPC .......... *H01L 33/385* (2013.01); *H01L 33/007* (2013.01); *H01L 33/0093* (2020.05); *H01L 33/24* (2013.01); *H01L 33/44* (2013.01); *H01L 2933/0016* (2013.01); *H01L 2933/0025* (2013.01)

(58) Field of Classification Search
CPC . H01L 33/385; H01L 33/0093; H01L 33/007; H01L 33/24; H01L 33/44; H01L 2933/0016; H01L 2933/0025
See application file for complete search history.

(56) References Cited

U.S. PATENT DOCUMENTS

2020/0083197 A1* 3/2020 Zou ..................... H01L 33/0093

FOREIGN PATENT DOCUMENTS

JP 2006-140247 A 6/2006

* cited by examiner

*Primary Examiner* — Kenneth Parker
*Assistant Examiner* — Christopher A Culbert
(74) *Attorney, Agent, or Firm* — Foley & Lardner LLP

(57) ABSTRACT

A method of manufacturing a light emitting element includes forming an n-side electrode at a lateral surface of an n-type semiconductor layer so as not to cover a light extraction surface. Using a portion of a silicon substrate left on an n-type semiconductor layer as a mask, an insulating film formed at a lateral surface of a semiconductor layered body is removed, to expose a lateral surface of the n-type semiconductor layer and a lateral surface of a resin layer. An n-side electrode positioned between the lateral surface of the n-type semiconductor layer and the lateral surface of the resin layer and connected to the exposed lateral surface of the n-type semiconductor layer is formed. Thereafter, the portion of the silicon substrate is removed, to expose the n-type semiconductor layer.

16 Claims, 11 Drawing Sheets

METHOD OF MANUFACTURING LIGHT EMITTING ELEMENT

CROSS-REFERENCE TO RELATED PATENT APPLICATION

The present application claims priority under 35 U.S.C. § 119 to Japanese Patent Application No. 2019-110506, filed Jun. 13, 2019, the contents of which are incorporated herein by reference in their entirety.

BACKGROUND

The present disclosure relates to a method of manufacturing a light emitting element.

It is desired to reduce the size of a light emitting element, such as a light emitting diode, that is disposed as a pixel in a display device. As the light emitting element is further reduced in size, it becomes difficult to have two electrodes, i.e., the anode and the cathode, disposed on the same side. Additionally, a configuration in which a transparent electrode is formed at the light extraction surface suffers reduced light extraction efficiency as compared to a configuration in which a transparent electrode is not formed at the light extraction surface. For example, Japanese Patent Publication No. 2006-140247 discloses a configuration including a layered body including a p-type semiconductor layer, a light emitting layer, and an n-type semiconductor layer in sequence. In this configuration, an anode-side electrode is formed on the lower surface of the p-type semiconductor layer, and a cathode-side electrode is formed at the lateral surface of the n-type semiconductor layer.

SUMMARY

An object of one embodiment of the present disclosure is to provide a simplified method of manufacturing a light emitting element, which method includes forming an n-side electrode at a lateral surface of an n-type semiconductor layer so as not to cover a light extraction surface.

According to one embodiment, a method of manufacturing a light emitting element includes: providing a wafer including a silicon substrate and a semiconductor layered body including, on the silicon substrate, an n-type semiconductor layer, a light emitting layer, and a p-type semiconductor layer in sequence; forming a p-side electrode on the p-type semiconductor layer; forming an insulating film at a lateral surface of the semiconductor layered body; after forming the insulating film, forming a resin layer covering the silicon substrate and the insulating film; after forming the resin layer, selectively removing the silicon substrate to expose the insulating film and the resin layer from the silicon substrate while leaving a portion of the silicon substrate on the n-type semiconductor layer; removing the insulating film exposed from the silicon substrate using the portion of the silicon substrate as a mask, to expose a lateral surface of the n-type semiconductor layer and a lateral surface of the resin layer; forming an n-side electrode positioned between the lateral surface of the n-type semiconductor layer and the lateral surface of the resin layer and connected to the exposed lateral surface of the n-type semiconductor layer; and after forming the n-side electrode, removing the portion of the silicon substrate, to expose the n-type semiconductor layer.

According to another embodiment, a method of manufacturing a light emitting element includes: providing a wafer including a silicon substrate and a semiconductor layered body including, on the silicon substrate, an n-type semiconductor layer, a light emitting layer, and a p-type semiconductor layer in sequence; separating the semiconductor layered body into a plurality of element parts; forming a p-side electrode on the p-type semiconductor layer; forming an insulating film at a lateral surface of the semiconductor layered body of each of adjacent ones of the plurality of element parts; after forming the insulating film, forming a resin layer covering the silicon substrate and the insulating film and positioned between the adjacent ones of the plurality of element parts; after forming the resin layer, selectively removing the silicon substrate to expose the insulating film and the resin layer from the silicon substrate while leaving a portion of the silicon substrate on the n-type semiconductor layer; removing the insulating film disposed at the lateral surface of the semiconductor layered body at each of the adjacent ones of the plurality of element parts, to expose a lateral surface of the n-type semiconductor layer and a lateral surface of the resin layer; forming an n-side electrode at an upper surface of the resin layer between the adjacent ones of the plurality of element parts, the n-side electrode positioned between the lateral surface of the n-type semiconductor layer and the lateral surface of the resin layer and connecting the adjacent ones of the plurality of element parts via the lateral surface of the n-type semiconductor layer of each of the adjacent ones of the plurality of element parts; and after forming the n-side electrode, removing the portion of the silicon substrate, to expose the n-type semiconductor layer.

According to another embodiment, a method of manufacturing a light emitting element includes: providing a wafer including a silicon substrate and a semiconductor layered body including, on the silicon substrate, an n-type semiconductor layer, a light emitting layer, and a p-type semiconductor layer in sequence; removing the p-type semiconductor layer and the light emitting layer of the semiconductor layered body to expose a portion of the n-type semiconductor layer from the p-type semiconductor layer and the light emitting layer, to form a mesa part including the p-type semiconductor layer and the light emitting layer; forming a p-side electrode on the p-type semiconductor layer of the mesa part; forming a first insulating film at a lateral surface of the mesa part; after forming the first insulating film, removing the portion of the n-type semiconductor layer to expose the silicon substrate from the n-type semiconductor layer, to form a lateral surface of the n-type semiconductor layer; forming a first n-side electrode at the lateral surface of the n-type semiconductor layer; forming a second insulating film at a lateral surface of the first n-side electrode; after forming the second insulating film, forming a resin layer covering the silicon substrate and the second insulating film; after forming the resin layer, selectively removing the silicon substrate to expose the second insulating film and the resin layer from the silicon substrate while leaving a portion of the silicon substrate on the n-type semiconductor layer; removing the second insulating film exposed from the silicon substrate using the portion of the silicon substrate as a mask, to expose the lateral surface of the first n-side electrode and a lateral surface of the resin layer; forming a second n-side electrode positioned between the lateral surface of the first n-side electrode and the lateral surface of the resin layer and connected to the lateral surface of the exposed first n-side electrode; and after forming the second n-side electrode, removing the portion of the silicon substrate to expose the n-type semiconductor layer.

According to another embodiment, a method of manufacturing a light emitting element includes: providing a wafer including a silicon substrate and a semiconductor layered body including, on the silicon substrate, an n-type semiconductor layer, a light emitting layer, and a p-type semiconductor layer in sequence; removing the p-type semiconductor layer and the light emitting layer of the semiconductor layered body to expose a portion of the n-type semiconductor layer from the p-type semiconductor layer and the light emitting layer, to form a plurality of mesa parts including the p-type semiconductor layer and the light emitting layer; forming a p-side electrode on the p-type semiconductor layer of each of the plurality of mesa parts; forming a first insulating film at a lateral surface of each of adjacent ones of the plurality of mesa parts; separating the semiconductor layered body into a plurality of element parts including the mesa parts and removing the portion of the n-type semiconductor layer positioned between the adjacent ones of the plurality of mesa parts, to form a lateral surface of the n-type semiconductor layer of each of adjacent ones of the plurality of element parts; forming a first n-side electrode at the lateral surface of the n-type semiconductor layer of each of the adjacent ones of the plurality of element parts; forming a second insulating film at a lateral surface of the first n-side electrode disposed at each of the adjacent ones of the plurality of element parts; after forming the second insulating film, forming a resin layer covering the silicon substrate and the second insulating film and positioned between the adjacent ones of the plurality of element parts; after forming the resin layer, selectively removing the silicon substrate to expose the second insulating film and the resin layer from the silicon substrate while leaving a portion of the silicon substrate on the n-type semiconductor layer of each of the plurality of element parts; removing the second insulating film disposed at each of the adjacent ones of the plurality of element parts exposed from the silicon substrate using the portion of the silicon substrate as mask, to expose the lateral surface of the first n-side electrode and a lateral surface of the resin layer; forming a second n-side electrode positioned between the lateral surface of the first n-side electrode and the lateral surface of the resin layer, the second n-side electrode being formed at an upper surface of the resin layer between the adjacent ones of the plurality of element parts and connecting the adjacent ones of the plurality of element parts via the lateral surface of the first n-side electrode of each of the adjacent ones of the plurality of element parts; and after forming the second n-side electrode, removing the portion of the silicon substrate to expose the n-type semiconductor layer.

The present disclosure provides a simplified method of manufacturing a light emitting element, which method includes forming an n-side electrode at a lateral surface of an n-type semiconductor layer so as not to cover a light extraction surface.

DETAILED DESCRIPTION

Figure 1:
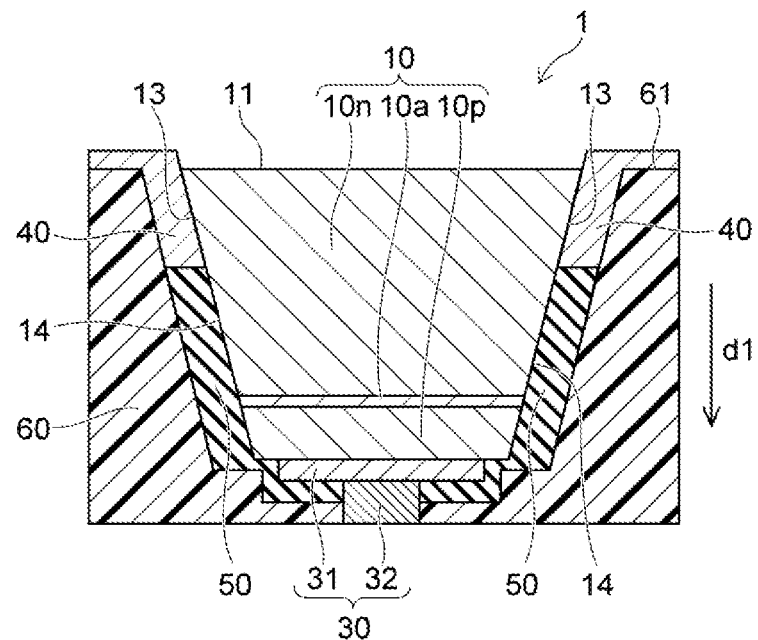
FIG. 1 is a schematic cross-sectional view of a light emitting element according to a first embodiment of the present disclosure.

Embodiments of the invention will be described below with reference to the drawings. Throughout the drawings, identical elements are denoted by the same reference numerals.

Figure 2:
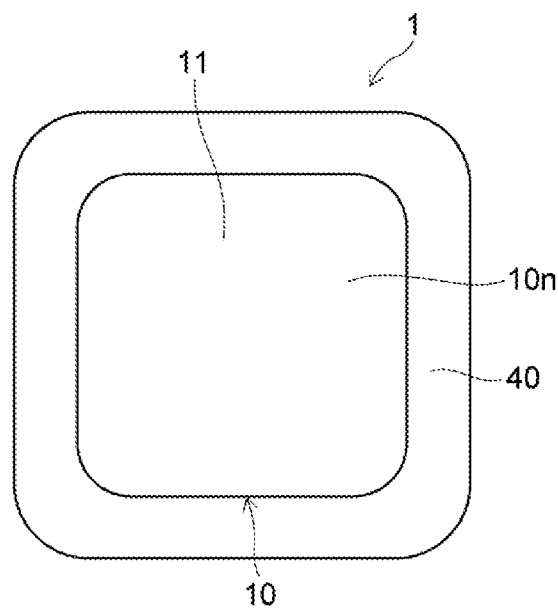
FIG. 2 is a schematic top view of the light emitting element according to the first embodiment of the present disclosure.

FIG. 1 is a schematic cross-sectional view of a light emitting element 1 according to a first embodiment of the present disclosure. FIG. 2 is a schematic top view of the light emitting element 1.

The light emitting element 1 includes a semiconductor layered body 10. The semiconductor layered body 10 is a layered body formed of a plurality of semiconductor layers of, for example, nitride semiconductors. In the present specification, the term "nitride semiconductor" includes semiconductors of every composition having the chemical formula $In_xAl_yGa_{1-x-y}N$ ($0 \leq x \leq 1$, $0 \leq y \leq 1$, $x+y \leq 1$), in which the composition ratio for x and y is varied in each range.

The semiconductor layered body 10 includes a p-type semiconductor layer 10p, a light emitting layer 10a, and an n-type semiconductor layer 10n. The direction from the n-type semiconductor layer 10n to the p-type semiconductor layer 10p is defined as the first direction d1. The thickness direction of the semiconductor layered body 10 extends in the first direction dl. The light emitting layer 10a is disposed, in the first direction d1, between the n-type semiconductor layer 10n and the p-type semiconductor layer 10p. The peak emission wavelength of the light emitting layer 10a is within a range of, for example, about 430 nm to 540 nm, inclusive, and emits blue-color light or green-color light.

The upper surface of the n-type semiconductor layer 10n functions as a light extraction surface 11 from which light from the light emitting layer 10a is primarily extracted. At the lower surface of the p-type semiconductor layer 10p (the lower surface of the semiconductor layered body 10) positioned on the side opposite to the light extraction surface 11 in the first direction d1, a p-side electrode 30 is disposed.

The p-side electrode 30 includes a first p-side electrode 31 and a second p-side electrode 32. The first p-side electrode 31 is disposed between the p-type semiconductor layer 10p and the second p-side electrode 32, and is in contact with the p-type semiconductor layer 10p.

The first p-side electrode 31 functions as a contact layer that forms a good ohmic contact for the p-type semiconductor layer 10p. The first p-side electrode 31 is, for example, a conductive metal oxide film. The conductive metal oxide film may be, for example, an oxide containing at least one element selected from the group consisting of Zn, In, Sn, Ga, and Ti. The material of the first p-side electrode 31 is, for example, ITO (Indium Tin Oxide). The material of the second p-side electrode 32 is, for example, a metal material containing at least one element selected from the group consisting of Cr, Ni, Au, Ti, Pt, and Ru. The second p-side electrode 32 may have a layered structure formed of a plurality of metal layers.

An insulating film 50 is disposed at a portion of the lateral surface of the semiconductor layered body 10. The insulating film 50 covers the lateral surface of the p-type semiconductor layer 10p and the lateral surface of the light emitting layer 10a. The insulating film 50 covers the surface in the lower surface of the p-type semiconductor layer 10p except for the surface with which the first p-side electrode 31 is in contact. The insulating film 50 covers the surface in the surface of the first p-side electrode 31 except for the surface with which the second p-side electrode 32 is in contact with. The insulating film 50 is, for example, a silicon oxide film.

The insulating film 50 is also disposed at a lower-layer-side lateral surface 14 in the n-type semiconductor layer 10n, and covers the lateral surface 14. An upper-layer-side lateral surface 13 of the n-type semiconductor layer 10n is formed continuously to the lower-layer-side lateral surface 14. The lateral surface 13 and the light extraction surface 11 form an acute angle. The lateral surface 13 is inclined relative to the first direction d1. An n-side electrode 40 is disposed at the lateral surface 13 and is in contact with the lateral surface 13. The material of the n-side electrode 40 is preferably a metal material that forms an ohmic contact for the n-type semiconductor layer 10n. The n-side electrode 40 is, for example, a metal material such as Ti or Cr.

The semiconductor layered body 10 has, for example, an inverted trapezoidal cross-sectional shape in the state where the light extraction surface 11 is oriented upward. A resin layer 60 is disposed around the lateral surface of the semiconductor layered body 10. Between the resin layer 60 and the lateral surface of the semiconductor layered body 10, the n-side electrode 40 and the insulating film 50 are disposed. The resin layer 60 covers the lateral surface of the n-side electrode 40 and the lateral surface of the insulating film 50.

The resin layer 60 covers the insulating film 50 on the lower surface side of the semiconductor layered body 10. The resin layer 60 covers the lateral surface of the second p-side electrode 32. The lower surface of the second p-side electrode 32 is exposed from the resin layer 60.

The n-side electrode 40 is disposed also at the upper surface 61 of the resin layer 60. This improves the mountability as compared to the case in which the n-side electrode 40 is disposed just between the lateral surface 13 and the resin layer 60. In a top view of FIG. 2, for example, the upper surface of the n-side electrode 40 is formed in an annular shape surrounding the light extraction surface 11. In a cross-sectional view, the shape of the n-side electrode 40 includes an inclined part inclined along the lateral surface 13, and a flat part along the upper surface 61 of the resin layer 60.

The n-side electrode 40 and the resin layer 60 are not disposed on the light extraction surface 11 and do not cover the light extraction surface 11. By virtue of the n-side electrode 40 being disposed so as not to cover the light extraction surface 11, no light absorption by the n-side electrode 40 occurs. Thus, light from the light emitting layer 10a is efficiently extracted.

As necessary, on the light extraction surface 11, a fluorescent material layer or a lens may be disposed. For example, by disposing a fluorescent material layer that contains a fluorescent material that converts part of light from the light emitting element 1 to yellow-color light on the light extraction surface 11 of the light emitting element 1 emitting blue-color light, a light emitting device with which white-color light is extracted is disposed.

Next, with reference to FIGS. 3 to 11, a description will be given of a method of manufacturing the light emitting element 1 according to the first embodiment.

Figure 3:
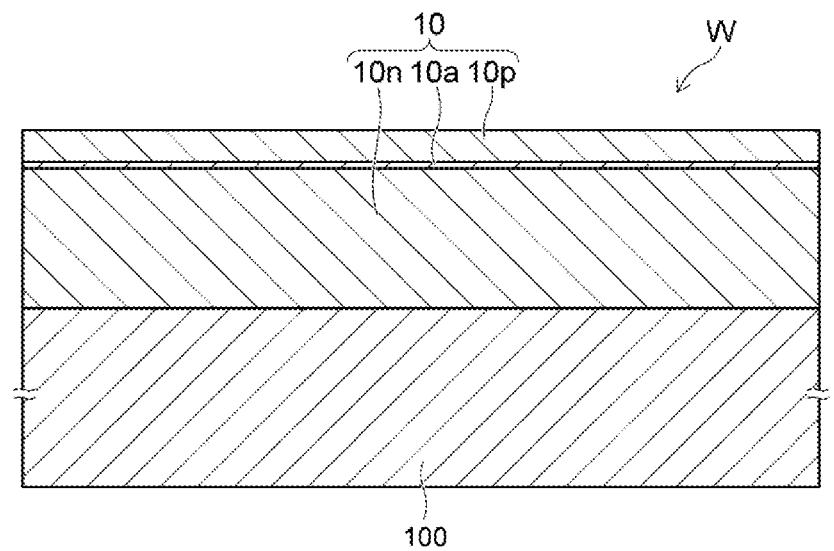
FIG. 3 is a schematic cross-sectional view showing a method of manufacturing a light emitting element according to the first embodiment of the present disclosure.

Firstly, a wafer W in FIG. 3 is disposed. The wafer W includes a silicon substrate 100 and the semiconductor layered body 10. The semiconductor layered body 10 is, for example, epitaxially grown on the silicon substrate 100 by MOCVD (metal organic chemical vapor deposition). The semiconductor layered body 10 includes the n-type semiconductor layer 10n, the light emitting layer 10a, and the p-type semiconductor layer 10p, which are formed in sequence on the silicon substrate 100.

Figure 4:
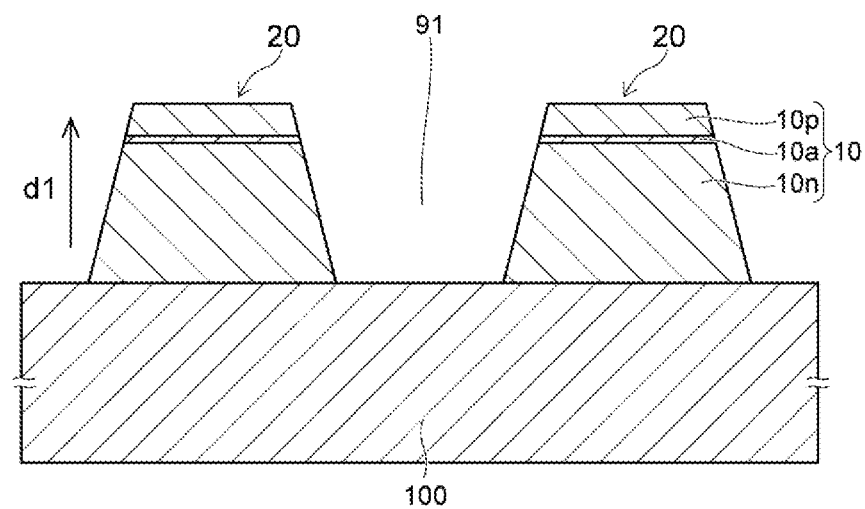
FIG. 4 is a schematic cross-sectional view showing the method of manufacturing a light emitting element according to the first embodiment of the present disclosure.

As shown in FIG. 4, the semiconductor layered body 10 is divided into a plurality of element parts 20 on the silicon substrate 100. For example, a portion of the semiconductor layered body 10 is etched in the thickness direction by RIE (Reactive Ion Etching), to form a groove 91 that reaches the silicon substrate 100. The groove 91 is formed, for example, grid-like, whereby a plurality of island-like or column-like element parts 20 is obtained. The element parts 20 each include the n-type semiconductor layer 10n, the light emitting layer 10a, and the p-type semiconductor layer 10p in order from the silicon substrate 100 side.

In the state where the silicon substrate 100 is on the lower side, each element part 20 has a trapezoidal cross-sectional shape. That is, the lateral surface of the element part 20 is inclined relative to the first direction dl from the n-type semiconductor layer 10n to the p-type semiconductor layer 10p.

Figure 5:
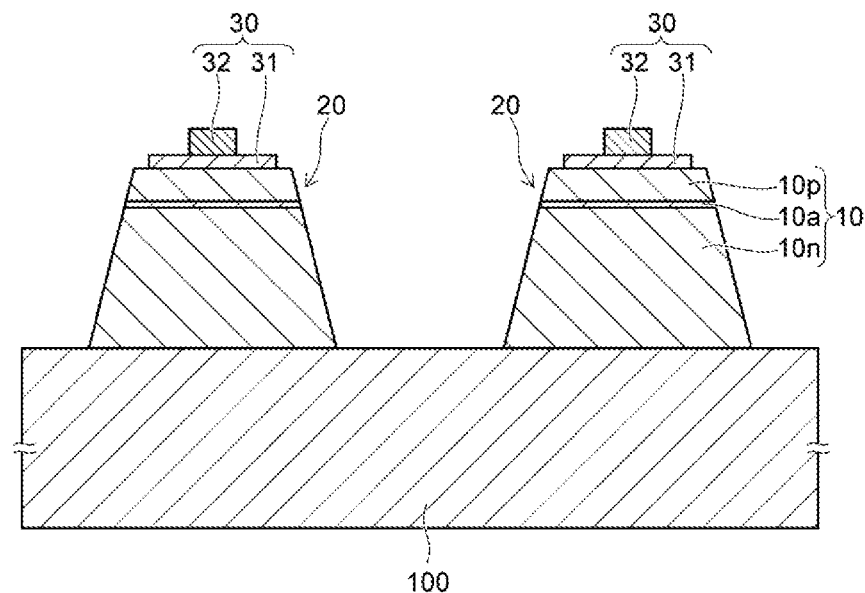
FIG. 5 is a schematic cross-sectional view showing the method of manufacturing a light emitting element according to the first embodiment of the present disclosure.

As shown in FIG. 5, the p-side electrode 30 is formed on the p-type semiconductor layer 10p of each of the plurality of element parts 20. The first p-side electrode 31 is formed on the upper surface of the p-type semiconductor layer 10p. On the first p-side electrode 31, the second p-side electrode 32 is formed.

Figure 6:
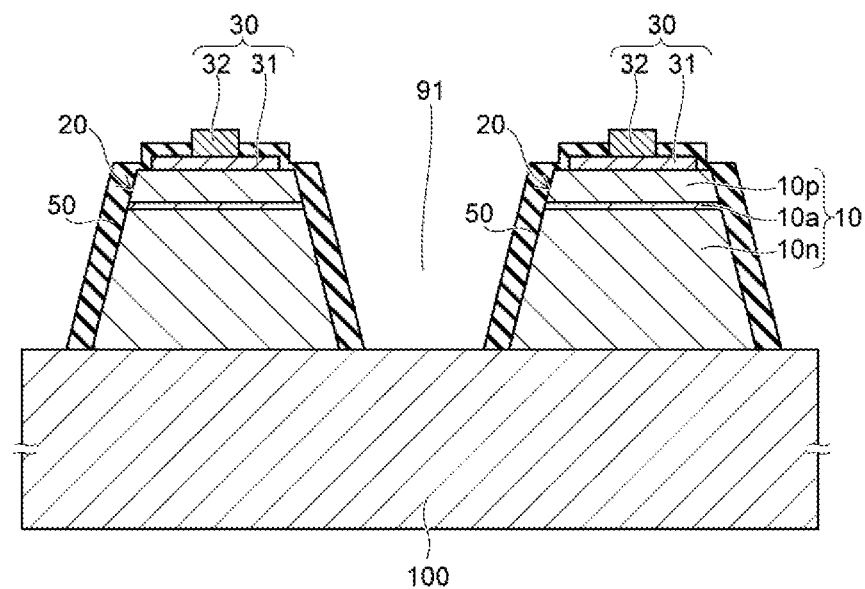
FIG. 6 is a schematic cross-sectional view showing the method of manufacturing a light emitting element according to the first embodiment of the present disclosure.

After the p-side electrode 30 is formed, as shown in FIG. 6, the insulating film 50 is formed at the lateral surface of the semiconductor layered body 10 of each of the plurality of element parts 20. The insulating film 50 is also formed at the upper surface of the semiconductor layered body 10, the upper surface and the lateral surface of the first p-side electrode 31, and the lateral surface of the second p-side electrode 32. The insulating film 50 is formed at the lateral surface of the semiconductor layered body 10 of each of adjacent ones of the plurality of element parts 20. As the insulating film 50, for example, a silicon oxide film is formed by CVD (Chemical Vapor Deposition) or ALD (Atomic Layer Deposition).

The insulating film 50 is formed continuously at the lateral surface of the semiconductor layered body 10, the p-side electrode 30, and at the upper surface of the silicon substrate 100 at the bottom of the groove 91. Thereafter, for example, a resist is formed to cover the surfaces except for the upper surface of the silicon substrate 100 at the bottom of the groove 91 and the upper surface of the second p-side electrode 32. Using the resist as a mask, the insulating film 50 is etched. The etching of the insulating film 50 is carried out by, for example, RIE. Thus, the insulating film 50 is partially removed, whereby the upper surface of the silicon substrate 100 at the bottom of the groove 91 and the upper surface of the second p-side electrode 32 are exposed from the insulating film 50.

Figure 7:
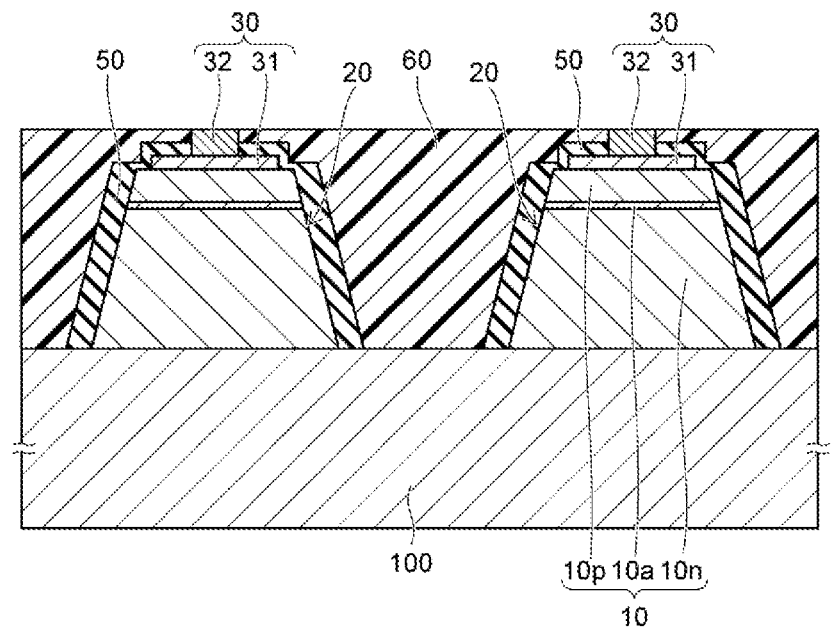
FIG. 7 is a schematic cross-sectional view showing the method of manufacturing a light emitting element according to the first embodiment of the present disclosure.

After the insulating film 50 is formed, as shown in FIG. 7, the resin layer 60 is formed on the silicon substrate 100. The resin layer 60 covers the upper surface of the silicon substrate 100 and the insulating film 50, and positioned between adjacent ones of the plurality of element parts 20 to fill up the space between the element parts 20. After the resin layer 60 is formed so as to cover the p-side electrode 30, the resin layer 60 positioned on the second p-side electrode 32 is removed by, for example, polishing or grinding, and the upper surface of the second p-side electrode 32 is exposed from the resin layer 60.

After the resin layer 60 is formed and the upper surface of the second p-side electrode 32 is exposed from the resin layer 60, in the state where the surface in the resin layer 60, which is on the side opposite to the surface in contact with the silicon substrate 100, is supported by a supporting body other than the silicon substrate 100, grinding is performed from the lower surface side of the silicon substrate 100, to reduce the thickness of the silicon substrate 100.

Figure 8:
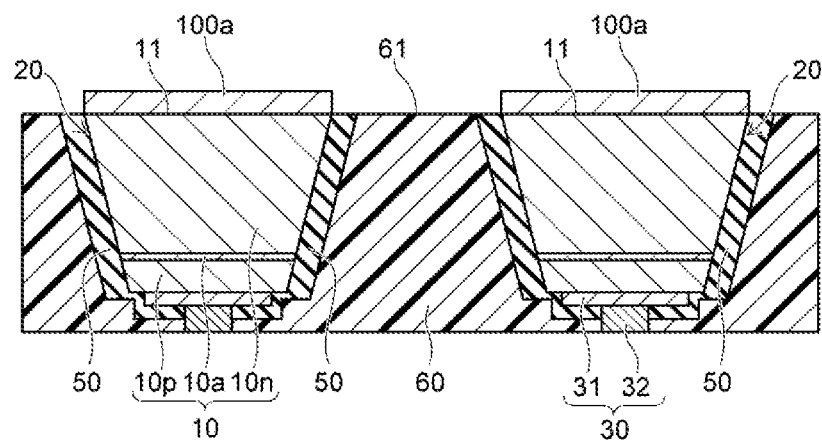
FIG. 8 is a schematic cross-sectional view showing the method of manufacturing a light emitting element according to the first embodiment of the present disclosure.

After the thickness of the silicon substrate 100 is reduced, as shown in FIG. 8, the silicon substrate 100 is selectively removed. That is, a portion 100a of the silicon substrate 100 is left. For example, a resist is formed on the silicon substrate 100. The resist is patterned. Using the patterned resist as a mask, the silicon substrate 100 is selectively removed by RIE. The mask for selectively removing the silicon substrate 100 is patterned into a shape that covers the n-type semiconductor layer 10n of each of the plurality of element parts 20.

By the selectively removing the silicon substrate 100, on the n-type semiconductor layer 10n of each of the plurality of element parts 20, the portion 100a of the silicon substrate 100 is left. The upper surface of the n-type semiconductor layer 10n to be the light extraction surface 11 is covered with the portion 100a of the silicon substrate 100. The upper surface 61 of the resin layer 60 and the upper surface of the insulating film 50 between the upper surface 61 of the resin layer 60 and the light extraction surface 11 are exposed from the silicon substrate 100. The thickness of the portion 100a of the silicon substrate 100 is adjusted as appropriate so as to obtain the function as a mask in etching using the portion 100a of the silicon substrate 100 as a mask, which will be described later.

By reducing the thickness of the silicon substrate 100 as described above before the selectively etching a portion of the silicon substrate 100, the etching amount and the etching time for the silicon substrate 100 are reduced. The reducing the thickness also contributes to improving the patterning precision of the silicon substrate 100.

After selectively removing the silicon substrate 100, using the portion 100a of the silicon substrate 100 left on the n-type semiconductor layer 10n as a mask, a portion of the insulating film 50 exposed from the silicon substrate 100 is removed. For example, the insulating film 50 formed of a silicon oxide film or a silicon nitride film is etched by ME using fluorine-based gas. The etching proceeds from the upper end side of the insulating film 50, and the etching process continues for a predetermined time.

Figure 9:
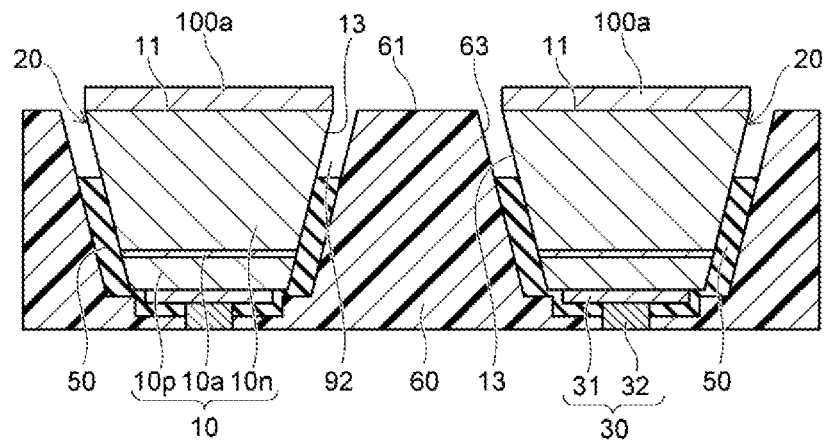
FIG. 9 is a schematic cross-sectional view showing the method of manufacturing a light emitting element according to the first embodiment of the present disclosure.

By the removing a portion of the insulating film 50, as shown in FIG. 9, the lateral surface 13 of the n-type semiconductor layer 10n on the upper layer side (the light extraction surface 11 side) of each of the plurality of element parts 20 is exposed. A lateral surface 63 of the resin layer 60 that opposes to the lateral surface 13 via a gap 92 is also exposed.

The etching time is controlled so that the etching the insulating film 50 stops before the upper edge of the insulating film 50 reaches the light emitting layer 10a, so as to prevent removal of the insulating film 50 that covers the lateral surface of the light emitting layer 10a and the lateral surface of the p-type semiconductor layer 10p. The etching the insulating film 50 is preferably performed so as to expose the area of the lateral surface 13 of the n-type semiconductor layer 10n by a range of, for example, 50% to 80%, inclusive. Exposing the lateral surface 13 by an area of 50% or more reliably provides the contact area between the n-side electrode 40 and the lateral surface 13. Exposing the lateral surface 13 by an area of 80% or less avoids contact between the n-side electrode 40 and the light emitting layer 10a or the p-type semiconductor layer 10p.

Figure 10:
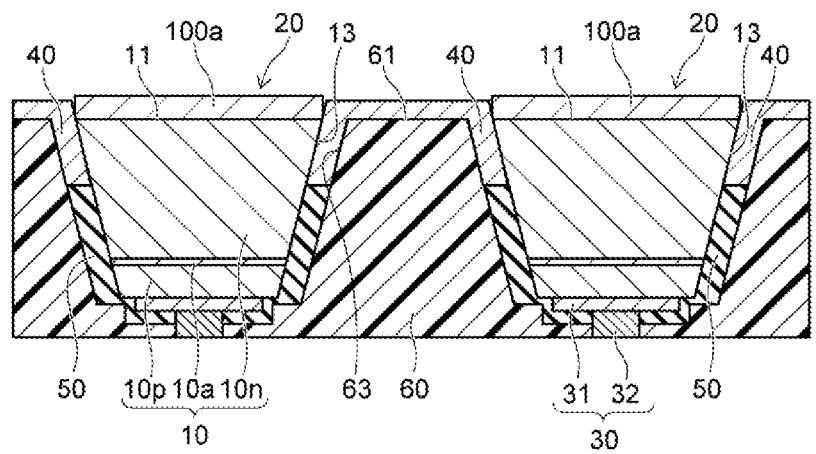
FIG. 10 is a schematic cross-sectional view showing the method of manufacturing a light emitting element according to the first embodiment of the present disclosure.

As shown in FIG. 10, at the gap 92 formed by the removing the insulating film 50, the n-side electrode 40 is formed. Since the n-side electrode 40 is formed using the portion 100a of the silicon substrate 100 as a mask, it is not necessary to separately provide a mask for forming the n-side electrode 40. The n-side electrode 40 is formed of, for example, a metal material such as Ti or Cr. The n-side electrode 40 is formed by, for example, plating.

The n-side electrode 40 is positioned between the lateral surface 13 of the n-type semiconductor layer 10n and the lateral surface 63 of the resin layer 60, and connected to the lateral surface 13 of the n-type semiconductor layer 10n exposed in the previous step. The n-side electrode 40 is also formed at the upper surface 61 of the resin layer 60 between adjacent ones of the plurality of element parts 20, and connects the adjacent ones of the plurality of element parts 20 via the lateral surface 13 of the n-type semiconductor layer 10n of each of the adjacent ones of the plurality of element parts 20. The light extraction surface 11 of the n-type semiconductor layer 10n is covered with the portion 100a of the silicon substrate 100 and, therefore, the n-side electrode 40 is not formed on the light extraction surface 11.

After the n-side electrode 40 is formed, the portion 100a of the silicon substrate 100 on the n-type semiconductor layer 10n is removed. For example, the portion 100a of the silicon substrate 100 on the n-type semiconductor layer 10n is entirely removed. The portion 100a of the silicon substrate 100 is removed by, for example, RIE using nitrogen-based gas.

Figure 11:
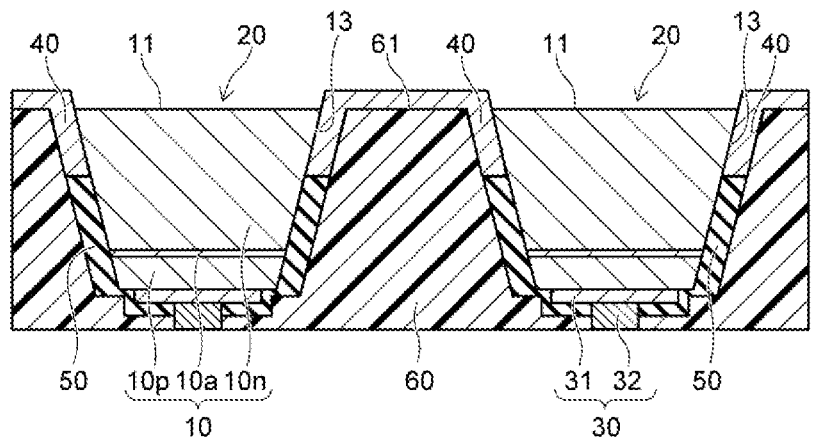
FIG. 11 is a schematic cross-sectional view showing the method of manufacturing a light emitting element according to the first embodiment of the present disclosure.

The portion 100a of the silicon substrate 100 is removed. Thus, as shown in FIG. 11, the light extraction surface 11 of the n-type semiconductor layer 10n is exposed.

After the portion 100a of the silicon substrate 100 is removed, singulating is performed in the wafer state, to obtain the light emitting element 1 shown in FIG. 1. The n-side electrode 40 on the upper surface 61 of the resin layer 60 between adjacent ones of the plurality of element parts 20 and the resin layer 60 under the n-side electrode 40 are cut in the thickness direction.

Note that, the light emitting element 1 may have a plurality of element parts 20. In the light emitting element 1 including a plurality of element parts 20, respective n-type semiconductor layers 10n of adjacent ones of the plurality of element parts 20 are connected to each other by respective lateral surfaces 13 of the n-type semiconductor layers 10n and a common n-side electrode 40 that is disposed at the upper surface 61 of the resin layer 60.

In the method of manufacturing the light emitting element 1 described above, in forming the n-side electrode 40 at the lateral surface 13 of the n-type semiconductor layer 10n so as not to cover the light extraction surface 11, the silicon substrate 100 used in growing the semiconductor layered body 10 is used as a mask. This eliminates the necessity of separately forming a mask in forming the n-side electrode 40 and thus simplifies the procedure. Additionally, the silicon substrate 100 is processed highly precisely at lower costs as compared to, for example, a sapphire substrate.

The thickness of the insulating film 50 is within a range of 0.8 μm to 6 μm, inclusive. Accordingly, the width of the gap 92 in FIG. 9 also is within a range of 0.8 μm to 6 μm, inclusive. A thickness of the insulating film 50 of 0.8 μm or more facilitates the forming the n-side electrode 40 at the region where the insulating film 50 has been removed. A thickness of the insulating film 50 of 6 μm or less reduces the time required for the etching the insulating film 50.

As described above, the lateral surface 13 is inclined so that the lateral surface 13 and the light extraction surface 11 of the n-type semiconductor layer 10n form an acute angle. Accordingly, as shown in FIG. 9, between the gaps 92 respectively adjacent to adjacent ones of the plurality of element parts 20, a portion of the resin layer 60 is left to have a trapezoidal cross-sectional shape. The n-side electrode 40 is formed along the upper surface 61 and the lateral surface 63 of the resin layer 60 of the trapezoidal cross-sectional shape. Provision of the n-side electrode 40 of such a shape improves coating characteristic of the n-side electrode 40 at the corner between the upper surface 61 and the lateral surface 63 of the resin layer 60, as compared to the case in which the n-side electrode 40 is formed along the upper surface 61 and the lateral surface 63 of the resin layer 60 of a quadrangular cross-sectional shape or an inverted trapezoidal cross-sectional shape. Additionally, this minimizes the risk of breakage of the n-side electrode 40 at the corner between the upper surface 61 and the lateral surface 63 of the resin layer 60 in forming the n-side electrode 40.

Figure 12:
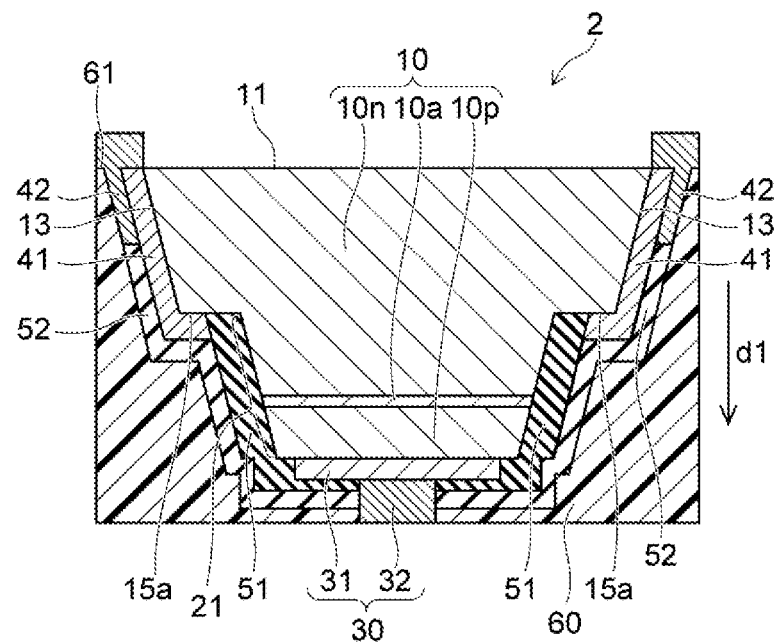
FIG. 12 is a schematic cross-sectional view of a light emitting element according to a second embodiment of the present disclosure.
Figure 13:
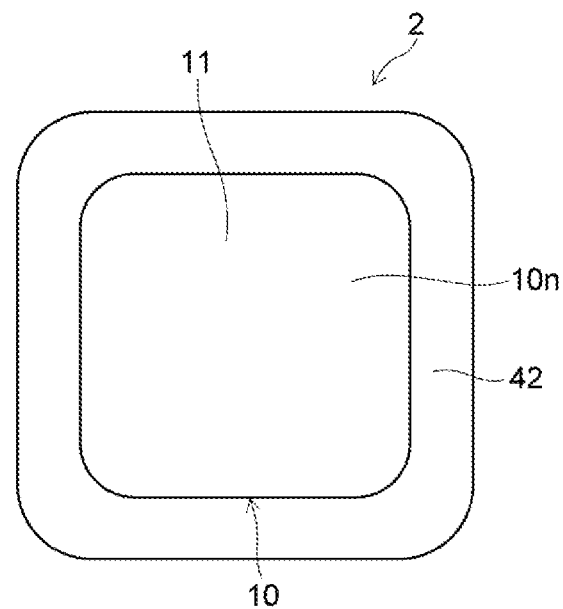
FIG. 13 is a schematic top view of the light emitting element according to the second embodiment of the present disclosure.

FIG. 12 is a schematic cross-sectional view of a light emitting element 2 according to a second embodiment of the present disclosure. FIG. 13 is a schematic top view of the light emitting element 2. An element identical to that in the light emitting element 1 according to the first embodiment is denoted by an identical reference character, and a detailed description thereof will not be repeatedly disposed.

Similarly to the light emitting element 1 according to the first embodiment, the light emitting element 2 includes the semiconductor layered body 10 that includes the n-type semiconductor layer 10n, the light emitting layer 10a, and the p-type semiconductor layer 10p. A step is formed at the lateral surface of the n-type semiconductor layer 10n of the light emitting element 2, whereby the semiconductor layered body 10 according to the light emitting element 2 is disposed with a mesa part 21.

The mesa part 21 includes the p-type semiconductor layer 10p, the light emitting layer 10a, and a portion of the n-type semiconductor layer 10n. The n-type semiconductor layer 10n includes the lateral surface 13 that forms an acute angle with the light extraction surface 11. Between the lateral surface 13 of the n-type semiconductor layer 10n and the lateral surface of the mesa part 21, a flat surface 15a of the n-type semiconductor layer 10n is disposed. The flat surface 15a of the n-type semiconductor layer 10n is a surface substantially parallel to the light extraction surface 11. The lateral surface 13 of the n-type semiconductor layer 10n, the lateral surface of the mesa part 21, and the flat surface 15a of the n-type semiconductor layer 10n are continuous to one another. The flat surface 15a is formed to be, for example, annular in a top view.

At the lower surface of the p-type semiconductor layer 10p, the p-side electrode 30 including the first p-side electrode 31 and a second p-side electrode 32 disposed under the first p-side electrode 31 is disposed.

At the lateral surface of the mesa part 21, a first insulating film 51 is disposed. The first insulating film 51 covers the lateral surface of the n-type semiconductor layer 10n in the mesa part 21. The first insulating film 51 covers the lateral surface of the p-type semiconductor layer 10p and the lateral surface of the light emitting layer 10a. The first insulating film 51 covers the surface in the lower surface in the p-type semiconductor layer 10p except for the surface with which the first p-side electrode 31 is in contact with. The first insulating film 51 is, for example, a silicon oxide film.

At the lateral surface 13 of the n-type semiconductor layer 10n, a first n-side electrode 41 is disposed, which first n-side electrode 41 is in contact with the lateral surface 13. The first n-side electrode 41 is also disposed at a portion of the flat surface 15a of the n-type semiconductor layer 10n. The material of the first n-side electrode 41 is preferably a metal material that forms an ohmic contact for the n-type semiconductor layer 10n. The first n-side electrode 41 is, for example, a metal material such as Ti or Cr.

At the lateral surface of the first n-side electrode 41 and the lateral surface of the first insulating film 51, a second insulating film 52 is disposed. The second insulating film 52 covers the surface of the first insulating film 51 that covers the surface of the first p-side electrode 31. The second insulating film 52 is disposed along the first n-side electrode 41 disposed at the lateral surface 13 and the flat surface 15a, and along the first insulating film 51 disposed at the lateral surface of the mesa part 21. In a cross-sectional view, the shape of the second insulating film 52 includes an inclined part inclined along the first n-side electrode 41, a flat part along the flat surface 15a, and an inclined part inclined along the first insulating film 51. The second insulating film 52 is, for example, a silicon oxide film.

At the lateral surface on the upper edge side (on the light extraction surface 11 side) of the first n-side electrode 41, the second insulating film 52 is not disposed and a second n-side electrode 42 is disposed. The second n-side electrode 42 is in contact with the lateral surface of the first n-side electrode 41. The material of the second n-side electrode 42 is, for example, a metal material such as Cu.

Around the lateral surface of the semiconductor layered body 10, the resin layer 60 is disposed. Between the resin layer 60 and the lateral surface of the semiconductor layered body 10, the second n-side electrode 42, the second insulating film 52, the first n-side electrode 41, and the first insulating film 51 are disposed. The resin layer 60 covers the lateral surface of the second n-side electrode 42 and the lateral surface of the second insulating film 52.

The resin layer 60 covers the second insulating film 52 on the lower surface side of the semiconductor layered body 10. The resin layer 60 covers the lateral surface of the second p-side electrode 32. The lower surface of the second p-side electrode 32 is exposed from the resin layer 60.

The second n-side electrode 42 is disposed also at the upper surface 61 of the resin layer 60 and the upper edge of the first n-side electrode 41. In a top view in FIG. 13, for example, the upper surface of the second n-side electrode 42 is formed to be annular surrounding the light extraction surface 11.

The first n-side electrode 41, the second n-side electrode 42, and the resin layer 60 are not disposed on the light extraction surface 11, and do not cover the light extraction surface 11. By virtue of the first n-side electrode 41 and the second n-side electrode 42 being disposed so as not to cover the light extraction surface 11, no light absorption by the n-side electrode 40 occurs. Thus, light from the light emitting layer 10a is efficiently extracted.

Next, with reference to FIGS. 14 to 24, a description will be given of a method of manufacturing the light emitting element 2 according to the second embodiment.

Firstly, similarly to the first embodiment, the wafer W in FIG. 3 is disposed. The wafer W includes the silicon substrate 100 and the semiconductor layered body 10.

Figure 14:
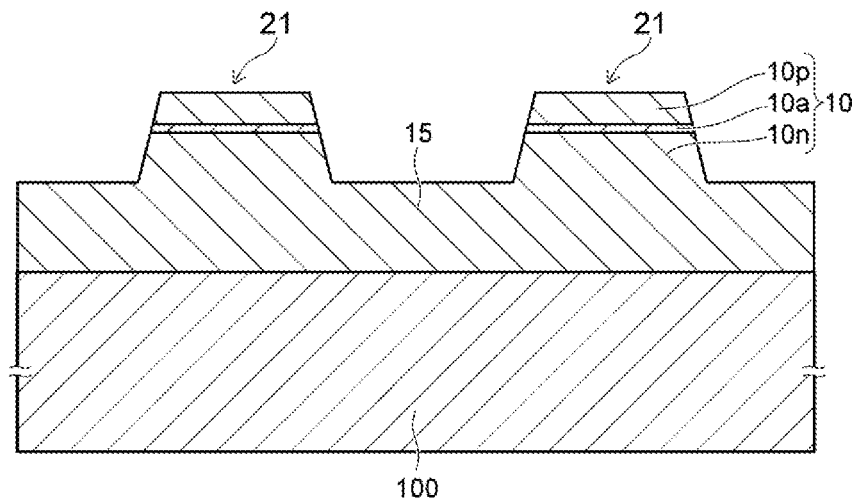
FIG. 14 is a schematic cross-sectional view showing a method of manufacturing a light emitting element according to the second embodiment of the present disclosure.

As shown in FIG. 14, at the semiconductor layered body 10, a plurality of mesa parts 21 is formed. For example by ME, the p-type semiconductor layer 10p, the light emitting layer 10a, and the n-type semiconductor layer 10n are selectively etched in sequence in the thickness direction. The etching by ME is stopped in the midway in the thickness direction of the n-type semiconductor layer 10n. Thus, a portion 15 of the n-type semiconductor layer 10n positioned between the mesa parts 21 is formed.

Figure 15:
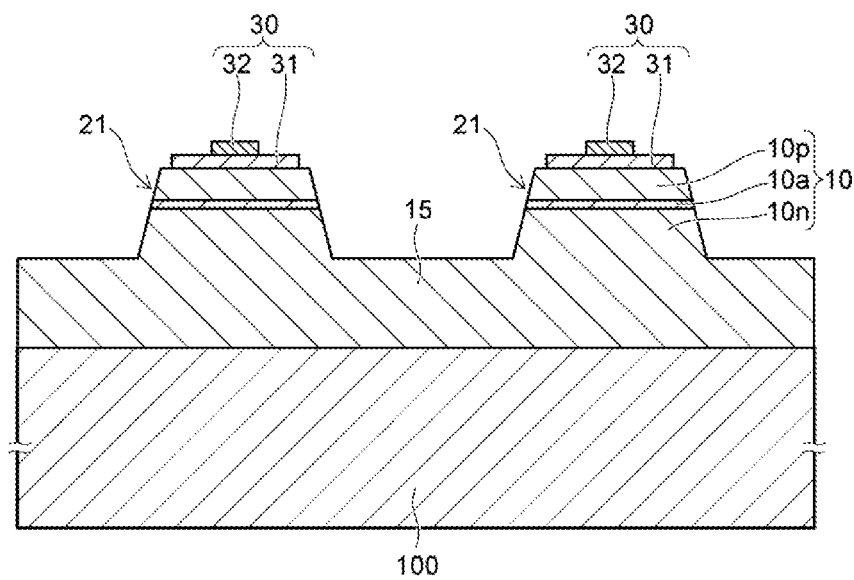
FIG. 15 is a schematic cross-sectional view showing the method of manufacturing a light emitting element according to the second embodiment of the present disclosure.

As shown in FIG. 15, on the p-type semiconductor layer 10p of each of the plurality of mesa parts 21, the p-side electrode 30 is formed. The first p-side electrode 31 is formed at the upper surface of the p-type semiconductor layer 10p, and the second p-side electrode 32 is formed on the first p-side electrode 31.

Figure 16:
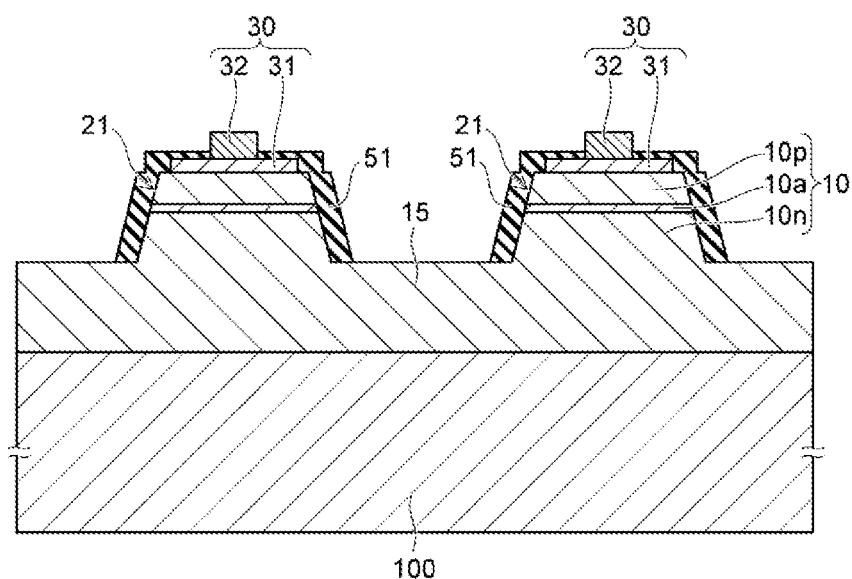
FIG. 16 is a schematic cross-sectional view showing the method of manufacturing a light emitting element according to the second embodiment of the present disclosure.

After the p-side electrode 30 is formed, as shown in FIG. 16, the first insulating film 51 is formed at the lateral surface of each of the plurality of exposed mesa parts 21. At the lateral surface of each of adjacent ones of the plurality of mesa parts 21, the first insulating film 51 is formed. As the first insulating film 51, for example, a silicon oxide film is formed by CVD or ALD.

The first insulating film 51 is continuously formed along the lateral surface of the mesa part 21, the p-side electrode 30, and the portion 15 of the n-type semiconductor layer 10n between the mesa parts 21. Thereafter, for example, a resist is formed to cover the portion other than the upper surface of the portion 15 of the n-type semiconductor layer 10n and the upper surface of the second p-side electrode 32. Using the resist as a mask, the insulating film 50 is etched. The etching of the insulating film 50 is carried out by, for example, RIE. Thus, the insulating film 50 is partially removed, to expose the upper surface of the portion 15 of the n-type semiconductor layer 10n and the upper surface of the second p-side electrode 32.

Figure 17:
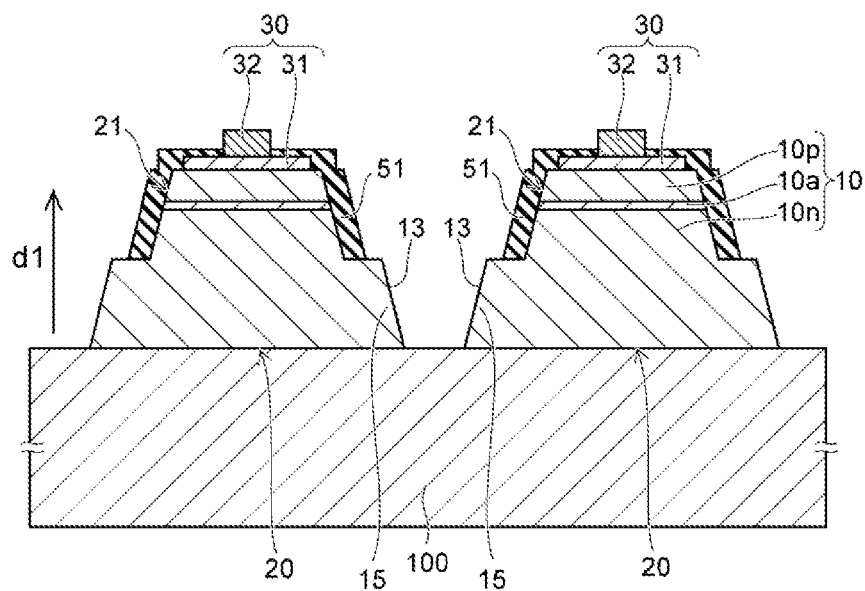
FIG. 17 is a schematic cross-sectional view showing the method of manufacturing a light emitting element according to the second embodiment of the present disclosure.

After the first insulating film 51 is formed, by the portion 15 of the n-type semiconductor layer 10n being etched in the thickness direction by, for example, RIE, as shown in FIG. 17, the semiconductor layered body 10 is separated into a plurality of element parts 20 on the silicon substrate 100. For example, a plurality of island-like or column-like element parts 20 is obtained. The element parts 20 each include the n-type semiconductor layer 10n, the light emitting layer 10a, and the p-type semiconductor layer 10p.

The lateral surface 13 of the portion 15 of the n-type semiconductor layer 10n at each of the plurality of element parts 20 is exposed. The lateral surface 13 of the portion 15 of the n-type semiconductor layer 10n is inclined relative to the first direction d1 from the n-type semiconductor layer 10n to the p-type semiconductor layer 10p. The upper surface of the silicon substrate 100 exposed between adjacent ones of the plurality of element parts 20 and the lateral surface 13 form an obtuse angle.

Figure 18:
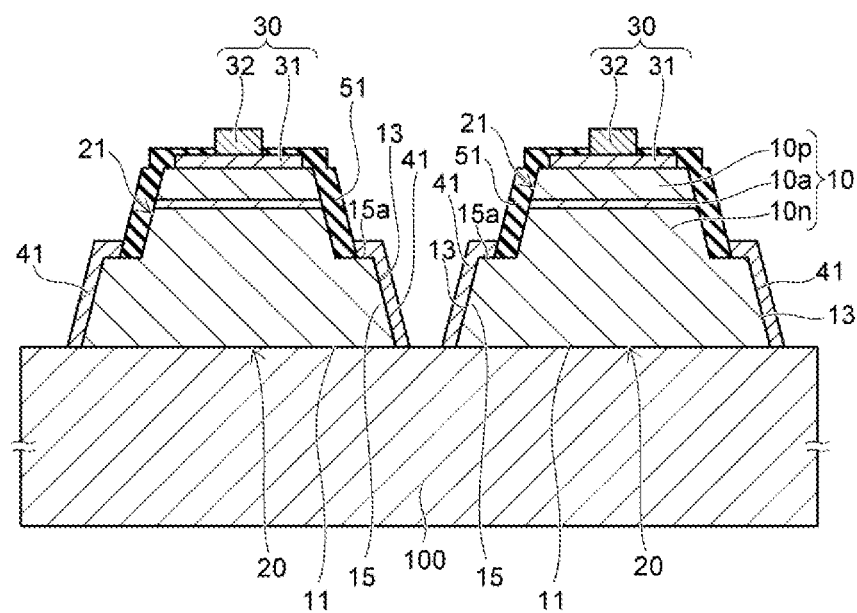
FIG. 18 is a schematic cross-sectional view showing the method of manufacturing a light emitting element according to the second embodiment of the present disclosure.

As shown in FIG. 18, at the lateral surface 13 of the portion 15 of the n-type semiconductor layer 10n, the first n-side electrode 41 is formed. The first n-side electrode 41 is formed also at a portion of the flat surface 15a between the lateral surface 13 and the lateral surface of the mesa part 21. The first n-side electrode 41 is preferably formed at least by 50% of the area of the flat surface 15a. This increases the contact area between the first n-side electrode 41 and the n-type semiconductor layer 10n. For example, the first n-side electrode 41 is formed by sputtering. Since the light extraction surface 11 is covered with the silicon substrate 100, the first n-side electrode 41 is not formed at the light extraction surface 11.

Figure 19:
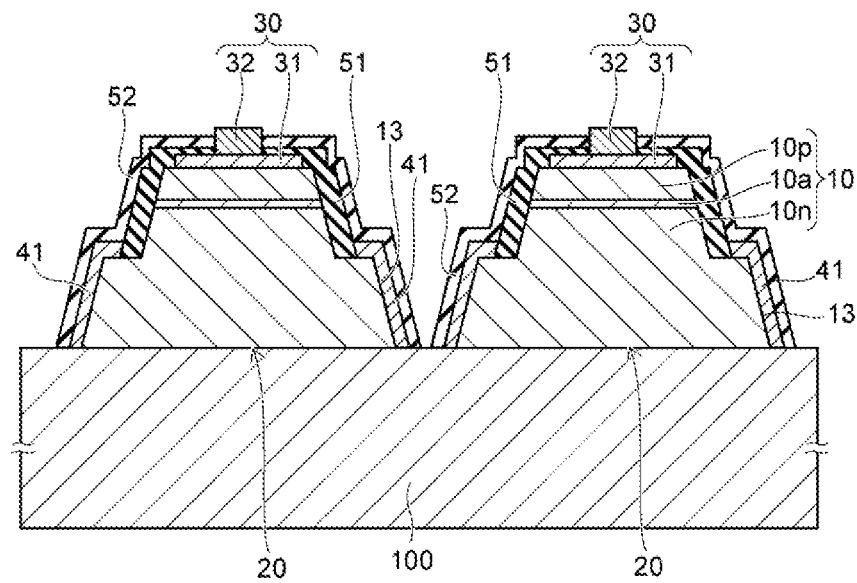
FIG. 19 is a schematic cross-sectional view showing the method of manufacturing a light emitting element according to the second embodiment of the present disclosure.

After the first n-side electrode 41 is formed, as shown in FIG. 19, the second insulating film 52 is formed at the lateral surface of the first insulating film 51 and the lateral surface of the first n-side electrode 41 of each of the plurality of element parts 20. As the second insulating film 52, for example, a silicon oxide film is formed by CVD or ALD.

The second insulating film 52 is formed continuously along the lateral surface of the first insulating film 51, the lateral surface of the first n-side electrode 41, the p-side electrode 30, and the upper surface of the silicon substrate 100 between the element parts 20. Thereafter, for example, a resist is formed to cover the surface other than a portion of the upper surface of the silicon substrate 100 and the upper surface of the second p-side electrode 32. Using the resist as a mask, the second insulating film 52 is etched. The etching of the second insulating film 52 is carried out by, for example, RIE. Thus, the second insulating film 52 is partially removed, and the upper surface of the silicon substrate 100 between the element parts 20 and the upper surface of the second p-side electrode 32 are exposed from the second insulating film 52.

Figure 20:
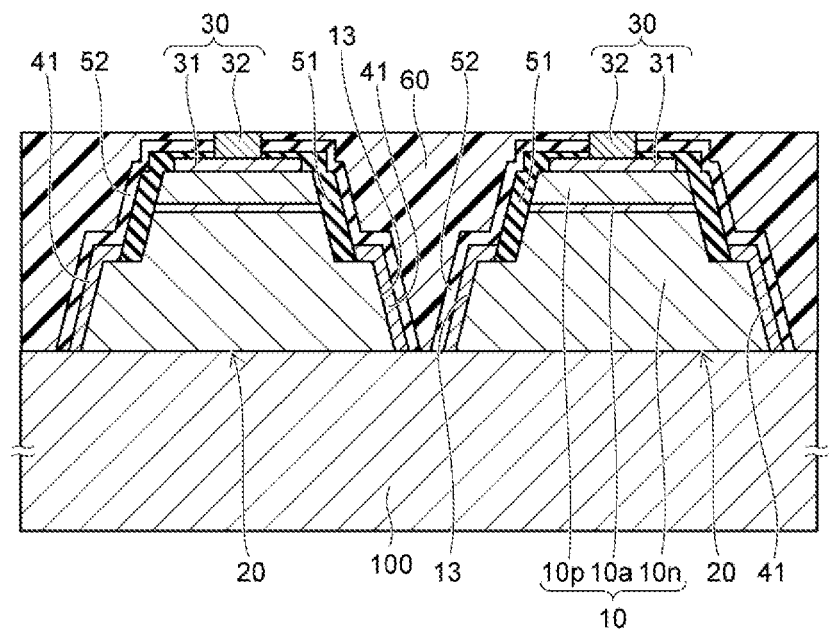
FIG. 20 is a schematic cross-sectional view showing the method of manufacturing a light emitting element according to the second embodiment of the present disclosure.

After the second insulating film 52 is formed, as shown in FIG. 20, the resin layer 60 is formed on the silicon substrate 100. The resin layer 60 covers the upper surface of the silicon substrate 100 and the second insulating film 52, and positioned between adjacent ones of the plurality of element parts 20 to fill up the space between the element parts 20. After the resin layer 60 is formed so as to cover the p-side electrode 30, the resin layer 60 positioned on the second p-side electrode 32 is removed by, for example, polishing or grinding, and the upper surface of the second p-side electrode 32 is exposed from the resin layer 60.

After the resin layer 60 is formed, in the state where the surface in the resin layer 60 that is on the side opposite to the surface in contact with the silicon substrate 100 is supported by a supporting body other than the silicon substrate 100, grinding is performed from the lower surface side of the silicon substrate 100, to reduce the thickness of the silicon substrate 100.

Figure 21:
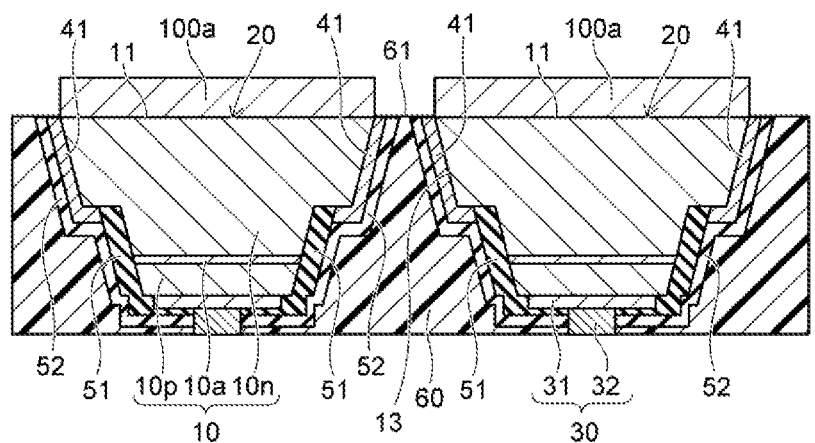
FIG. 21 is a schematic cross-sectional view showing the method of manufacturing a light emitting element according to the second embodiment of the present disclosure.

After the thickness of the silicon substrate 100 is reduced, as shown in FIG. 21, the silicon substrate 100 is selectively removed. For example, a resist is formed on the silicon substrate 100. The resist is patterned. Using the patterned resist as a mask, the silicon substrate 100 is selectively removed by RIE. The mask for selectively removing the silicon substrate 100 is patterned into a shape that covers the n-type semiconductor layer 10n of each of the plurality of element parts 20.

By the selectively removing the silicon substrate 100, on the n-type semiconductor layer 10n of each of the plurality of element parts 20, the portion 100a of the silicon substrate 100 is left. The upper surface of the n-type semiconductor layer 10n to be the light extraction surface 11 is covered with the portion 100a of the silicon substrate 100. The upper surface 61 of the resin layer 60, the upper surface of the second insulating film 52 between the upper surface 61 of the resin layer 60 and the light extraction surface 11, and the upper surface of the first n-side electrode 41 are exposed from the silicon substrate 100.

By reducing the thickness of the silicon substrate 100 as described above before the selectively etching a portion of the silicon substrate 100, the etching amount and the etching time for the silicon substrate 100 are reduced. The reducing the thickness also contributes to improving the patterning precision of the silicon substrate 100.

After selectively removing the silicon substrate 100, using the portion 100a of the silicon substrate 100 left on the n-type semiconductor layer 10n as a mask, a portion of the second insulating film 52 exposed from the silicon substrate 100 is removed. For example, the second insulating film 52 formed of a silicon oxide film is etched by RIE using fluorine-based gas. The etching proceeds from the upper edge side of the second insulating film 52, and the etching process continues for a predetermined time.

Figure 22:
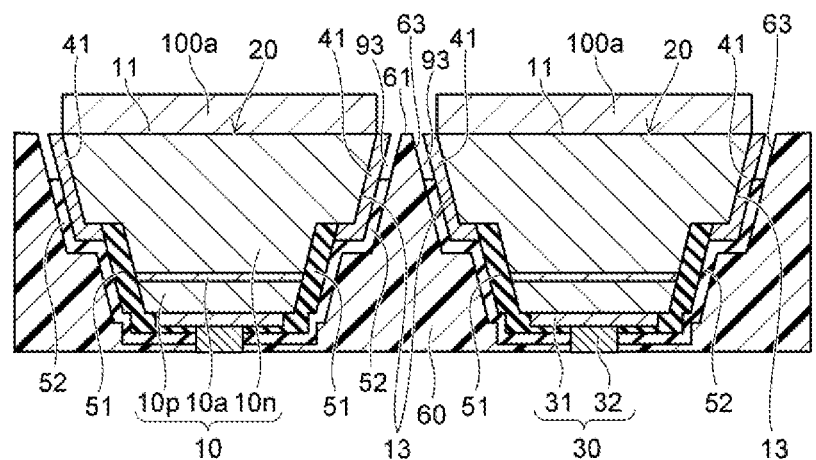
FIG. 22 is a schematic cross-sectional view showing the method of manufacturing a light emitting element according to the second embodiment of the present disclosure.

By the removing a portion of the second insulating film 52, as shown in FIG. 22, the lateral surface of the first n-side electrode 41 disposed at the lateral surface 13 of the n-type semiconductor layer 10n of each of the plurality of element parts 20 is exposed. The lateral surface 63 of the resin layer 60 that opposes to the lateral surface of the exposed first n-side electrode 41 via the gap 93 is also exposed.

The etching time is controlled so that the etching stops before the second insulating film 52 is etched to the portion covering the first insulating film 51. Thus, in etching the second insulating film 52, the first insulating film 51 will not be exposed to the etching gas or liquid. Even when the first insulating film 51 and the second insulating film 52 are formed of materials of a similar type, the first insulating film 51 that covers the lateral surface of the light emitting layer 10a and the lateral surface of the p-type semiconductor layer 10p will not be removed. The etching of the second insulating film 52 is preferably performed so as to expose 50% or more of the area of the lateral surface 13 of the n-type semiconductor layer 10n. Exposing the lateral surface 13 by an area of 50% or more reliably provides the contact area between the second n-side electrode 42 and the first n-side electrode 41.

Figure 23:
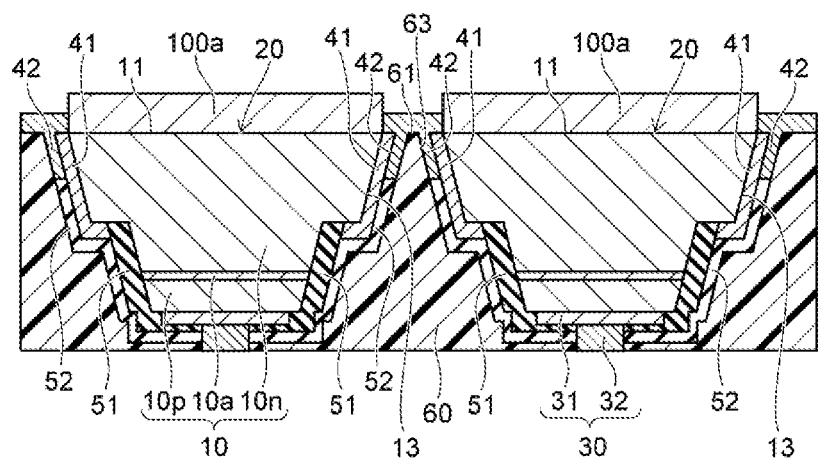
FIG. 23 is a schematic cross-sectional view showing the method of manufacturing a light emitting element according to the second embodiment of the present disclosure.

As shown in FIG. 23, at the gap 93 formed by the removing the second insulating film 52, the second n-side electrode 42 is formed. Since the second n-side electrode 42 is formed using the portion 100a of the silicon substrate 100 as a mask, it is not necessary to separately provide a mask for forming the second n-side electrode 42. The second n-side electrode 42 is formed of, for example, a metal material such as Cu. The second n-side electrode 42 is formed by, for example, plating.

The second n-side electrode 42 is positioned between the lateral surface of the first n-side electrode 41 and the lateral surface 63 of the resin layer 60, and connected to the lateral surface of the first n-side electrode 41 exposed in the previous step. The second n-side electrode 42 is connected to the lateral surface 13 of the n-type semiconductor layer 10n via the first n-side electrode 41.

The second n-side electrode 42 is also formed at the upper surface 61 of the resin layer 60 between adjacent ones of the plurality of element parts 20, and connects the adjacent ones of the plurality of element parts 20 via the lateral surface of the first n-side electrode 41 of each of the adjacent ones of the plurality of element parts 20. The light extraction surface 11 of the n-type semiconductor layer 10n is covered with the portion 100a of the silicon substrate 100 and, therefore, the second n-side electrode 42 is not formed on the light extraction surface 11.

After the second n-side electrode 42 is formed, the portion 100a of the silicon substrate 100 on the n-type semiconductor layer 10n is removed. The portion 100a of the silicon substrate 100 is removed by, for example, RIE using nitrogen-based gas.

Figure 24:
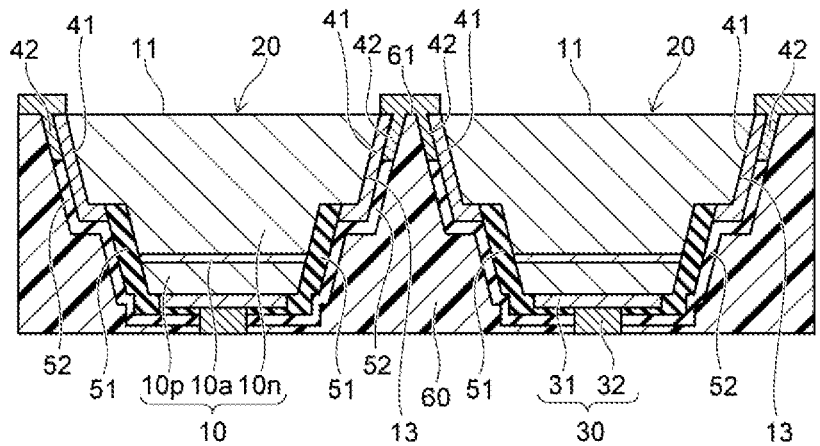
FIG. 24 is a schematic cross-sectional view showing the method of manufacturing a light emitting element according to the second embodiment of the present disclosure.

The portion 100a of the silicon substrate 100 is removed. Thus, as shown in FIG. 24, the light extraction surface 11 of the n-type semiconductor layer 10n is exposed.

After the portion 100a of the silicon substrate 100 is removed, singulating is performed in the wafer state, to obtain the light emitting element 2 shown in FIG. 12. The second n-side electrode 42 on the upper surface 61 of the resin layer 60 between adjacent ones of the plurality of element parts 20 and the resin layer 60 under the second n-side electrode 42 are cut in the thickness direction.

Note that, the light emitting element 2 may have a plurality of element parts 20. In the light emitting element 2 including a plurality of element parts 20, respective n-type semiconductor layers 10n of adjacent ones of the plurality of element parts 20 are connected to each other by respective first n-side electrodes 41 disposed at the lateral surfaces 13 of the n-type semiconductor layers 10n and a common second n-side electrode 42 that is disposed at the lateral surface of the first n-side electrode 41 and the upper surface 61 of the resin layer 60.

In the method of manufacturing the light emitting element 2 described above, before forming the second n-side electrode 42, the first n-side electrode 41 connected to the lateral surface 13 of the n-type semiconductor layer 10n is formed.

Thus, the contact area between the first n-side electrode 41 and the n-type semiconductor layer 10n is reliably obtained. In this manner, forming the second n-side electrode 42 in the state where the first n-side electrode 41 is formed easily provides electrical connection between the second n-side electrode 42 and the n-type semiconductor layer 10n. Similarly to the method of manufacturing a light emitting element according to the first embodiment, the silicon substrate 100 used in growing the semiconductor layered body 10 is used as a mask in forming the first n-side electrode 41 and the second n-side electrode 42 at the lateral surface 13 of the n-type semiconductor layer 10n so as not to cover the light extraction surface 11. This eliminates the necessity of separately forming a mask in forming the second n-side electrode 42 and thus simplifies the procedure. Additionally, with the silicon substrate 100, a light emitting element is manufactured at lower costs as compared to, for example, a sapphire substrate.

The thickness of the second insulating film 52 is preferably within a range of 0.8 µm to 6 µm, inclusive. Accordingly, the width of the gap 93 in FIG. 22 is also within a range of 0.8 µm to 6 µm, inclusive. A thickness of the second insulating film 52 of 0.8 µtm or more facilitates the forming the n-side electrode 40 at the region where the insulating film 50 has been removed. A thickness of the insulating film 50 of 6 µm or less reduces the time required for the etching the insulating film 50.

The lateral surface 13 is inclined so that the lateral surface 13 and the light extraction surface 11 of the n-type semiconductor layer 10n form an acute angle. The lateral surface of the first n-side electrode 41 formed at the lateral surface 13 and the lateral surface of the second insulating film 52 formed at the lateral surface of the first n-side electrode 41 are also inclined along the lateral surface 13 of the n-type semiconductor layer 10n.

Accordingly, as shown in FIG. 22, between the gaps 93 formed by the removing the second insulating film 52, a portion of the resin layer 60 is left to have a trapezoidal cross-sectional shape. The second n-side electrode 42 is formed along the upper surface 61 and the lateral surface 63 of the resin layer 60 of the trapezoidal cross-sectional shape. Provision of the second n-side electrode 42 of such a shape improves coating characteristic of the second n-side electrode at the corner between the upper surface 61 and the lateral surface 63 of the resin layer 60, as compared to the case in which the second n-side electrode 42 is formed along the upper surface 61 or the lateral surface 63 of the resin layer 60 of a quadrangular cross-sectional shape or an inverted trapezoidal cross-sectional shape. Additionally, this minimizes the risk of breakage of the second n-side electrode 42 at the corner between the upper surface 61 and the lateral surface 63 of the resin layer 60 in forming the second n-side electrode 42.

The method of manufacturing the light emitting element 1, 2 described above is not limited to the method of forming a plurality of light emitting elements 1, 2 simultaneously at once in a wafer state, and is applicable also to a method of forming a single light emitting element 1, 2.

In the foregoing, the description has been given of the embodiments of the present disclosure with reference to specific examples. However, the present disclosure is not limited to such specific examples. Every mode that can be carried out by a person skilled in the art on the basis of the above-described embodiments of the present disclosure with any appropriate design changes belongs to the scope of the present disclosure so long as it involves the gist of the present disclosure. Additionally, a person skilled in the art will arrive at various changes and modifications in the scope of the idea of the present disclosure. Such changes and modifications are also construed to belong to the scope of the present disclosure.

What is claimed is:

1. A method of manufacturing a light emitting element, the method comprising:
   providing a wafer comprising:
      a silicon substrate, and
      a semiconductor layered body comprising, on the silicon substrate in the following order, an n-type semiconductor layer, a light emitting layer, and a p-type semiconductor layer;
   forming a p-side electrode on the p-type semiconductor layer;
   forming an insulating film at a lateral surface of the semiconductor layered body;
   after forming the insulating film, forming a resin layer covering the silicon substrate and the insulating film;
   after forming the resin layer, selectively removing the silicon substrate to expose the insulating film and the resin layer from the silicon substrate while leaving a portion of the silicon substrate on the n-type semiconductor layer;
   removing the insulating film exposed from the silicon substrate using the portion of the silicon substrate as a mask, to expose a lateral surface of the n-type semiconductor layer and a lateral surface of the resin layer;
   forming an n-side electrode positioned between the lateral surface of the n-type semiconductor layer and the lateral surface of the resin layer and connected to the exposed lateral surface of the n-type semiconductor layer; and
   after forming the n-side electrode, removing the portion of the silicon substrate, to expose the n-type semiconductor layer.

2. The method of manufacturing a light emitting element according to claim 1, wherein a thickness of the insulating film is within a range of 0.8 µm to 6 µm, inclusive.

3. The method of manufacturing a light emitting element according to claim 1, wherein the lateral surface of the n-type semiconductor layer is inclined relative to a first direction from the n-type semiconductor layer to the p-type semiconductor layer.

4. A method of manufacturing a light emitting element, comprising:
   providing a wafer comprising:
      a silicon substrate, and
      a semiconductor layered body comprising, on the silicon substrate in the following order, an n-type semiconductor layer, a light emitting layer, and a p-type semiconductor layer;
   separating the semiconductor layered body into a plurality of element parts;
   forming a p-side electrode on the p-type semiconductor layer;
   forming an insulating film at a lateral surface of the semiconductor layered body of each of adjacent ones of the plurality of element parts;
   after forming the insulating film, forming a resin layer covering the silicon substrate and the insulating film and positioned between the adjacent ones of the plurality of element parts;
   after forming the resin layer, selectively removing the silicon substrate to expose the insulating film and the resin layer from the silicon substrate while leaving a portion of the silicon substrate on the n-type semiconductor layer;

removing the insulating film disposed at the lateral surface of the semiconductor layered body at each of the adjacent ones of the plurality of element parts, to expose a lateral surface of the n-type semiconductor layer and a lateral surface of the resin layer;

forming an n-side electrode at an upper surface of the resin layer between the adjacent ones of the plurality of element parts, the n-side electrode positioned between the lateral surface of the n-type semiconductor layer and the lateral surface of the resin layer and connecting the adjacent ones of the plurality of element parts via the lateral surface of the n-type semiconductor layer of each of the adjacent ones of the plurality of element parts; and after forming the n-side electrode, removing the portion of the silicon substrate, to expose the n-type semiconductor layer.

5. The method of manufacturing a light emitting element according to claim 4, wherein a thickness of the insulating film is within a range of 0.8 μm to 6 μm, inclusive.

6. The method of manufacturing a light emitting element according to claim 4, wherein the lateral surface of the n-type semiconductor layer is inclined relative to a first direction from the n-type semiconductor layer to the p-type semiconductor layer.

7. The method of manufacturing a light emitting element according to claim 2, wherein the lateral surface of the n-type semiconductor layer is inclined relative to a first direction from the n-type semiconductor layer to the p-type semiconductor layer.

8. The method of manufacturing a light emitting element according to claim 5, wherein the lateral surface of the n-type semiconductor layer is inclined relative to a first direction from the n-type semiconductor layer to the p-type semiconductor layer.

9. The method of manufacturing a light emitting element according to claim 1, wherein, in the step of forming the insulating film, a part of the silicon substrate is exposed from the insulating film.

10. The method of manufacturing a light emitting element according to claim 4, wherein, in the step of forming the insulating film, a part of the silicon substrate is exposed from the insulating film.

11. The method of manufacturing a light emitting element according to claim 1, wherein, in the step of forming the n-side electrode, the n-side electrode is formed surround the portion of the silicon substrate in a top view.

12. The method of manufacturing a light emitting element according to claim 4, wherein, in the step of forming the n-side electrode, the n-side electrode is formed surround the portion of the silicon substrate in a top view.

13. The method of manufacturing a light emitting element according to claim 1, wherein, in the step of removing the insulating film exposed from the silicon substrate, a lateral surface of the light emitting layer and a lateral surface of the p-type semiconductor layer are not exposed from the insulating film.

14. The method of manufacturing a light emitting element according to claim 4, wherein, in the step of removing the insulating film exposed from the silicon substrate, a lateral surface of the light emitting layer and a lateral surface of the p-type semiconductor layer are not exposed from the insulating film.

15. The method of manufacturing a light emitting element according to claim 1, wherein, in the step of forming the n-side electrode, a part of the n-side electrode is farther from the p-side electrode than a part of the n-type semiconductor layer, exposed from the portion of the silicon substrate, is from the p-side electrode.

16. The method of manufacturing a light emitting element according to claim 4, wherein, in the step of forming the n-side electrode, a part of the n- side electrode is farther from the p-side electrode than a part of the n-type semiconductor layer, exposed from the portion of the silicon substrate, is from the p-side electrode.

* * * * *